(12) United States Patent
Masleid et al.

(10) Patent No.: US 7,777,523 B1
(45) Date of Patent: Aug. 17, 2010

(54) LEVEL SHIFTER FLIP-FLOP

(75) Inventors: Robert P. Masleid, Mounte Sereno, CA (US); Jason M. Hart, Hayden, ID (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/359,933

(22) Filed: Jan. 26, 2009

(51) Int. Cl.
*H03K 19/094* (2006.01)
(52) U.S. Cl. ............................. 326/68; 326/80; 326/81
(58) Field of Classification Search .................... 326/68, 326/80–81; 327/333
See application file for complete search history.

(56) References Cited

U.S. PATENT DOCUMENTS

| | | | | |
|---|---|---|---|---|
| 7,348,813 | B1* | 3/2008 | Nanda et al. | 327/141 |
| 2001/0043085 | A1* | 11/2001 | Shimazaki et al. | 326/112 |
| 2004/0169544 | A1* | 9/2004 | Roy et al. | 327/379 |

* cited by examiner

*Primary Examiner*—Anh Q Tran
(74) *Attorney, Agent, or Firm*—Gregory P. Durbin; Polsinelli Shughart PC

(57) ABSTRACT

A flip-flop or other state circuit that includes level-shifting functionality. In connection with a flip-flop, embodiments include an inverter circuit element that has a data input line as its input and a data complement line as its output. The inverter resides in voltage domain that is lower than the voltage domain associated with remainder of the flip-flop.

19 Claims, 7 Drawing Sheets

LEVEL SHIFTER FLIP-FLOP

TECHNICAL FIELD

Aspects of the present invention are generally directed to circuits, and particularly to circuits that shift voltage levels between voltage domain of an integrated circuit.

BACKGROUND

In the field of a Very Large Scale Integration (VLSI) design, a method of reducing power or improving power efficiency is to modify the voltage at which circuits operate. Due to power constraints or other considerations, an integrated circuit may include more than one voltage region. In accordance with certain designs, an integrated circuit's digital circuits may operate in one voltage domain and the integrated circuit's SRAM cells may operate in a different voltage domain. This division of a integrated circuit may occur due to the difference in operating conditions in a digital circuit versus an SRAM cell. In particular, digital circuits typically use a relatively high amount of power and have a high leakage rate. Under these conditions, it may be preferable to operate at a relatively low voltage. In contrast, SRAM cells typically are resistant to leakage and do not use a relatively high amount of power. Moreover, SRAM cells tend to fail at low voltages. Accordingly, under these conditions, it is may be preferable to operate at a higher voltage. Operating an integrated circuit at two or more voltages may require shifting between the two levels. In particular, it may be necessary for a signal to travel between voltage domains. However, a signal that is output from a circuit stage in one voltage domain may not be capable of driving a circuit stage in another voltage domain. Accordingly, transitioning between voltage domains sometimes requires passing the signal through a level shifter.

Typically, transitioning from a high voltage region to a low voltage region may be done without a level shifter. Specifically, a signal defined in a higher voltage region may be used to drive a gate or other circuit element that resides in a lower voltage region. In contrast, transitioning from a lower voltage region to a higher voltage region may be problematic. While it may be possible to assert a logical low value at an input, it may not be possible to assert a logical high value at a gate input. In particular, because the two voltage regions have a common ground, asserting a logic low, which corresponds or substantially corresponds to ground, results in a valid logic low. In contrast, asserting a logical high value from a lower voltage domain may not result in a voltage level that is within the voltage range needed in the higher voltage region.

The fundamental nature of logic gates contributes to the difficulty in transitioning from a lower voltage domain to a higher voltage domain. A typical logic gate, such as those implemented with Complementary Metal Oxide Semi-conductor (CMOS) processes, include a pull-up transistor that provides a path to the power supply rail and a pull-down transistor that provides a path to ground. A logic input value that results in a logical high value at the output is one in which the pull-up transistor is on and the pull-down transistor is off. Similarly, a logic value that results in a logical low at the output is one in which the pull-up transistor is off and the pull-down transistor is on. In order for the pull-up and pull-down transistors to be fully turned on and off, the input voltages should range between ground and the power supply rail. Intermediate voltages between these values often result in indeterminate values or erroneous voltages at the output. Accordingly, asserting a high logic value from a lower voltage domain to a logic gate in a higher voltage domain may result in errors in the logic gate output. In particular, the pull-up transistor may not be fully on, the pull-down transistor may not be fully off, or both. Accordingly, in transitioning from a low voltage domain to a high voltage domain, it may be necessary to add a circuit stage that is devoted to facilitating the transition.

SUMMARY

Aspects of the invention are directed to a flip-flop or other state circuit that includes level-shifting functionality. In connection with a flip-flop, implementations conforming with various aspects of the present invention include an inverter circuit element that has a data input line as its input and a data complement line as its output. The inverter resides in a voltage domain that is lower than the voltage domain associated with remainder of the flip-flop. The flip-flop may additionally include pre-charge nodes that are selectively discharged based on the logical value present on the data and data complement lines.

An embodiment is directed to a flip-flop, including a data input line carrying a logical value represented by a first voltage range, the first voltage range between a reference voltage and a first power supply rail; a clock line operable to trigger a capture of the logical value carried by the data input to form a captured logical value; and a data output line carrying the captured logical value represented by a second voltage range, the second voltage range between the reference voltage and a second power supply rail; wherein the second power supply rail is greater than the first power supply rail.

Another embodiment is directed to a level-shifting method, comprising: receiving an input voltage from a first voltage domain, the first voltage being representative of a logical value; latching the logical value; and presenting an output voltage in a second voltage domain, the second voltage domain higher than the first voltage domain, the output voltage being representative of the latched logical value.

Another embodiment is directed to a flip-flop, including means for carrying an input logical value represented by a first voltage range, the first voltage range between a reference voltage and a first power supply rail; means for triggering a capture of the input logical value carried by the means for carrying, wherein the capture results in a captured logical value; and means for carrying the captured logical value represented by a second voltage range, the second voltage range between the reference voltage and a second power supply rail; wherein the second power supply rail is greater than the first power supply rail.

DETAILED DESCRIPTION

Implementations discussed herein are directed to a circuit element, such as a flip-flop, that includes a level shifting functionality. Embodiments are directed to circuit designs that, in addition to the circuit's logic functionality, allow the circuit to function as a level shifter. More particularly, implementations discussed herein avoid adding a dedicated circuit stage for the purpose of level shifting. Avoiding adding a dedicated level shifter may have a number of advantages for the circuit designer. For instance, power consumption may be lowered, additional circuit delay may avoided and/or circuit area may be preserved.

Implementations discussed herein are directed to shifting between voltage domains within an integrated circuit. More specifically, implementations are directed to passing a signal or otherwise transitioning from a lower voltage domain to a higher voltage domain. As used herein, a voltage domain refers to a portion of an integrated circuit that operates at a certain voltage. More particularly, power is provided to circuit elements within the voltage domain by a power supply rail that defines a maximum voltage. As used herein, two voltage domains $V_{DD}$ and $V_{CS}$ are discussed. For the purposes of this disclosure, $V_{DD}$ is defined as being a lower voltage domain than $V_{CS}$. More particularly, the power supply rail associated with the $V_{DD}$ voltage domain is lower than the power supply rail defined or associated with the $V_{CS}$ voltage domain.

Figure 1:
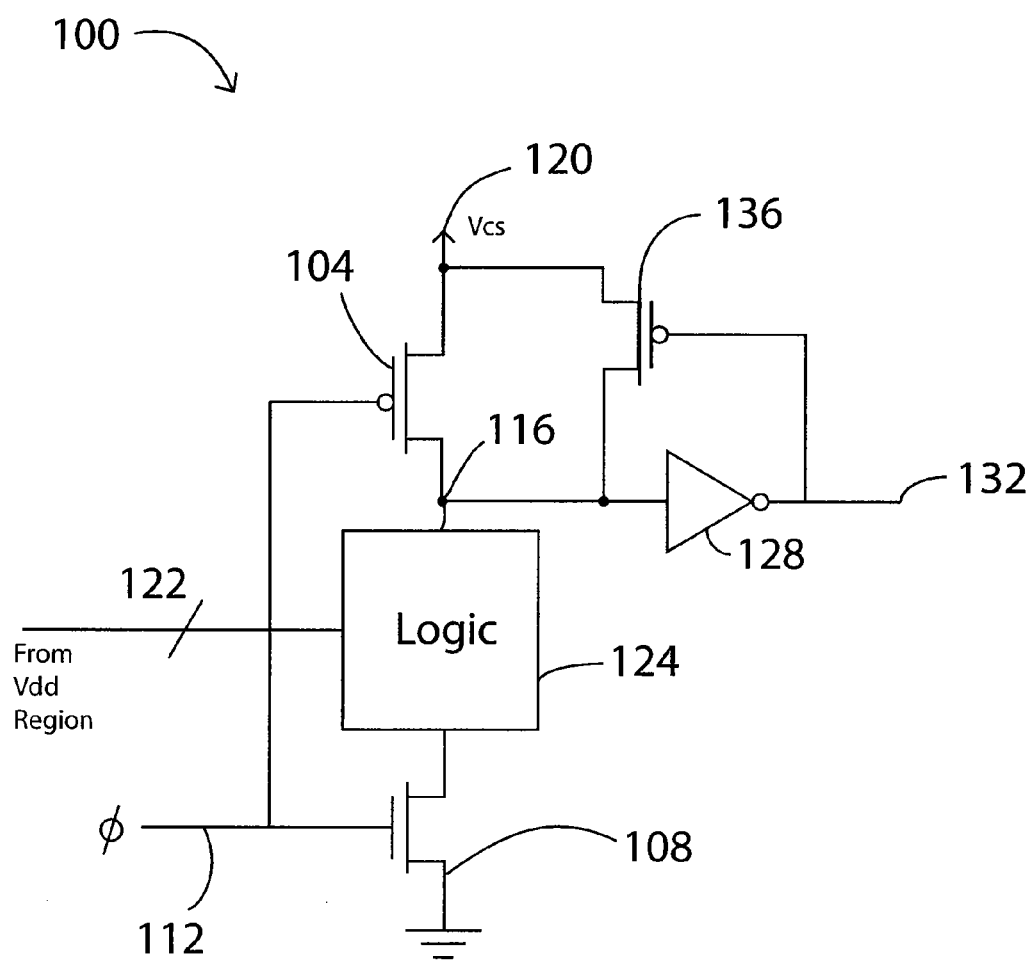
FIG. 1 is a schematic illustration of a dynamic circuit having a generic logic section.

Implementations discussed herein are directed to a circuit stage or element that accomplishes a logical function as well as shifts between voltage domains. In accordance with implementations discussed herein, characteristics of dynamic circuits are exploited to accomplish level shifting. Generally, the operation of a dynamic circuit includes a pre-charge phase and an evaluate phase. An example dynamic circuit is shown in FIG. 1 and is generally referred to with reference numeral 100. The circuit 100 includes a pre-charge transistor 104 and an evaluate transistor 108. The pre-charge transistor 104 and the evaluate transistor 108 are each supplied with a clock 112 connected to their respective gates. When the clock is low, the pre-charge transistor 104 is on and the evaluate transistor 108 is off. In this pre-charge phase, an internal node 116 is charged by the pre-charge transistor 104 to a high voltage.

During the evaluate phase, the internal node 116 is selectively discharged based on whether or not a logic condition associated with logic section 124 is or is not satisfied. The logic section 124 is illustrated generically in FIG. 1, but may include transistors arrangements that define logic conditions such as, for example, AND, NAND, NOR, and OR. The logic section 124 may conduct or otherwise provide a path to ground during the evaluate phase when the associated logic condition is satisfied or otherwise evaluates as TRUE. Example logic sections 124 are shown in FIGS. 2A-2C.

Figure 2A:
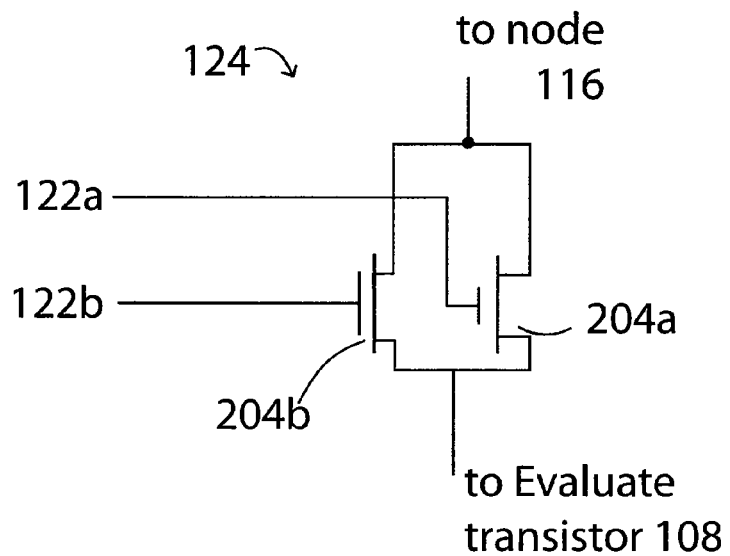
FIG. 2A through 2C are schematic illustrations of example logic sections for the dynamic circuit shown in FIG. 1.
Figure 2B:
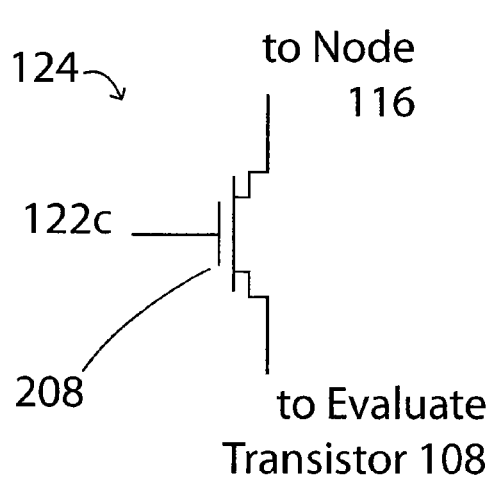
Figure 2C:
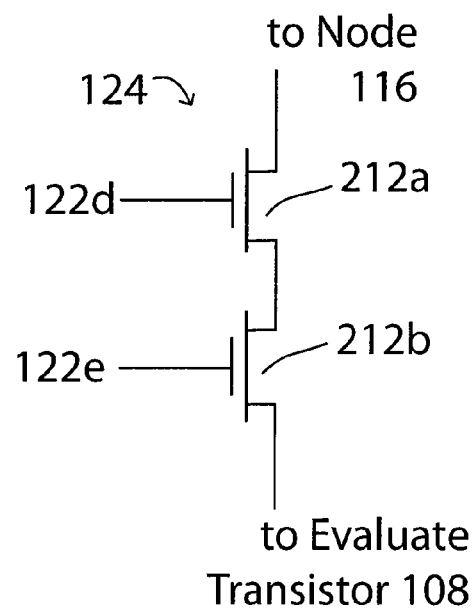

As shown in FIG. 2A, logic 124 may include a 2-OR gate. In this instance, the input to the logic section 124 includes two input lines 122a, b. Each input line 122a, b may be connected to a transistor 204a, b. When either or both input lines 122a, b are high, one or more of the transistors 204a, b will be on. Here, the logic section's OR logic condition is satisfied and the logic section 124 evaluates as TRUE. More particularly, a conduction path exists through the logic section 124, between the node 116 and the evaluate transistor 108.

The path to ground may be completed when the clock 112 is high during the evaluate phase. When the clock 112 is high, the evaluate transistor 108 is on and the pre-charge transistor 104 is off. When the evaluate transistor 108 is on and the logic condition of the logic section 124 is satisfied, a path to ground exists at the internal node 116. Accordingly, the charge that was established at the internal node 116 during the pre-charge phase may be discharged. Alternatively, if the logic condition of the logic section 124 is not satisfied, no path to ground exists at the internal node 116. In this way, the internal node 116 is initially set to a high or logical "one" value in the pre-charge phase and conditionally discharged to a low or logical "zero" value depending on the inputs to the logic 124 during the evaluate phase.

In addition to the 2-OR logic function implemented by the circuit shown in FIG. 2A, other logic conditions may implemented at logic section 124. For example, as shown in FIG. 2B, a logic section 124 may include a single gate 208. In this instance, the input to the logic 124 includes a single line 122c. With a high value at the logic input 122c, the transistor 208 will be on. With transistor 208 on, a path to ground will exist at the internal node 116 during the evaluate phase. As shown in FIG. 2C, a logic section 124 may implement an AND function. Here, the input to logic section 124 includes two input lines 122d,e. Each input line 122d,e may be connected to a transistor 212a,b. With both input lines 122d,e high, both transistors 212a,b will be on. In this way, an AND function is implemented by the logic section 124.

Referring again to FIG. 1, even when the logical condition at logic 124 is not satisfied, a small leakage current may be present. Accordingly the logic value established by the pre-charge at internal node 116 during the pre-charge phase may be degraded by this leakage current. Accordingly, the circuit 100 may include a keeper transistor 136 adapted to counteract this leakage current. Moreover, the value at the internal node 116 may additionally be inverted by an inverter 128 and provided as the circuit output at output line 132.

The dynamic circuit shown in FIG. 1 also provides level shifting to transition from a lower voltage domain to a higher voltage domain. In particular, the input or inputs 122 at logic 124 may be provided from a lower voltage region $V_{DD}$ and result in a valid output in a higher voltage region $V_{CS}$. A logical value is presented at output 132 based on the selective discharge of internal node 116. In presenting the logical value at output 132, node 116 is discharged or not discharged depending on whether or not the logic condition of logic section 124 is satisfied. Logic section 124 may be provided with inputs 122 from lower voltage region and operate properly to selectively discharge internal node 116. In this way, the circuit 100 may receive inputs may from a lower voltage region and produce outputs in a higher voltage region.

To further illustrate the level shifting functionality of the circuit 100 shown in FIG. 1, consider the case where logic section 124 is implemented as the 2-OR logic function shown in FIG. 2A. With a logical low value presented at both inputs 122, neither transistor 204 is on. Accordingly, the 2-OR logic function is not satisfied and the charge at internal node 116, which was established during the pre-charge phase, is not discharged. As this charge maintains the output at a valid logic level in the $V_{CS}$ domain, the circuit operates properly. With a logical high value presented at either or both of the inputs 122, one or more of the transistors 204 is on. Accordingly, the 2-OR logic function is satisfied and the charge at internal node 116, which was established during the pre-charge phase, is discharged. In discharging the internal node 116, the voltage level at input to logic 124 need not rise to the value that exists at the power supply rail 120. Because the value at the output 132 is maintained by a charge that is pre-established at internal node 116 and is not actively driven to a high state, it is possible to pull the node 116 low through logic 124. Here, all that is needed is for the voltage level at input 122 to exceed the threshold value of the logic transistors associated with logic 124.

The circuit 100 shown in FIG. 1 may be used to accomplish two tasks. Firstly, the circuit 100 may perform the logic function specified by logic 124. Additionally, the circuit 100 may be used to transition or shift from a lower voltage domain to a higher voltage domain. The circuit 100 shown in FIG. 1 is convenient in the instance the circuit design or layout specifies that a logic gate is to be located at the boundary between voltage regions or domains. However, in other instances, a logic gate may not be needed at the boundary between a lower voltage domain and a higher voltage domain. In particular, it may be the case that a state element such as a flip-flop may be needed at this point.

Typically, if a flip-flop or other state element is needed at the boundary between voltage domains, an additional circuit stage must be added. This is due to the fact that an input to a flip-flop must be fully driven between ground and the power supply rail of the flip-flop in order to avoid internal indeterminate states. More particularly, the input to a conventional flip-flop is used to switch both a pull-up and a pull-down transistor. Accordingly, a logical high value that is less than the power supply rail may result in an indeterminate value due to the fact that this input value is insufficient to completely turn on and off the pull-up and pull-down transistors. Accordingly, the voltage levels may need to be explicitly shifted from the lower voltage domain to the higher voltage domain prior to being received at the flip-flop that resides in the higher level voltage domain.

An explicit level shifting circuit may be used in the instance that a flip-flop is needed at a transition from a lower voltage region to a higher voltage region. For example, the circuit 100 may be used with the logic section 124 shown in FIG. 2B. Here, the logical value present at the input 122 will be passed to the output 132. In passing the logic value, the voltage domain will shift from the lower level voltage domain $V_{DD}$ to the higher level voltage domain $V_{CS}$. The logic value present at the output 132 may then be presented to the flip-flop that resides in the higher level voltage domain $V_{CS}$. Here, the circuit will operate as needed, however, an additional circuit stage will be added in order to accomplish the level shifting. Implementations discussed herein are directed to avoiding adding this additional circuit stage. More particularly, implementations discussed herein are directed to a flip-flop that includes a level shifting function.

Figure 3:
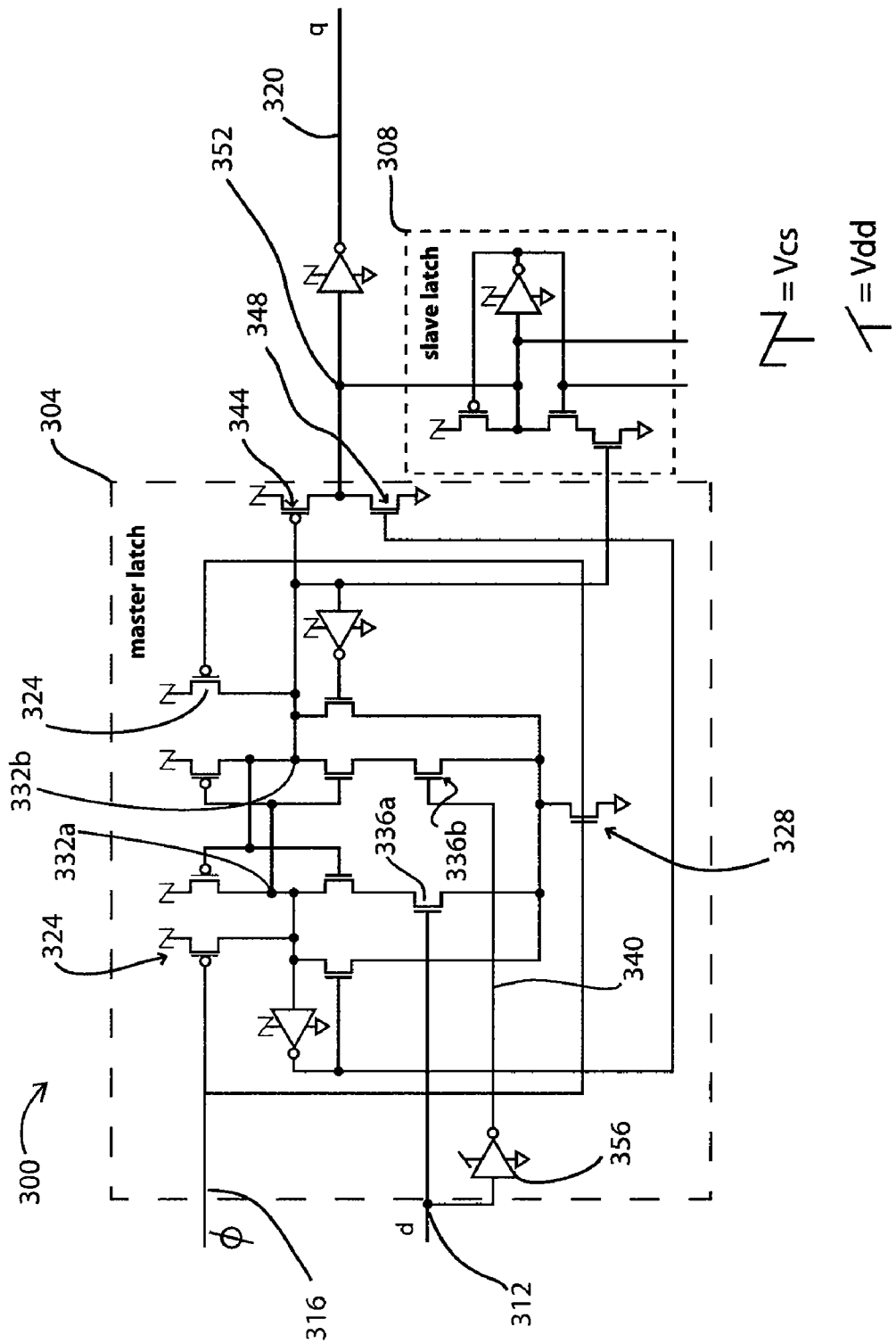
FIG. 3 is a schematic illustration of a level shifter flip-flop in accordance with implementations discussed herein.

Referring now to FIG. 3, a level shifter flip-flop is generally identified with the reference number 300. The flip-flop 300 generally resides in higher level voltage domain $V_{CS}$ and includes portions that are connected to the power supply rail associated with a lower voltage domain $V_{DD}$. By connecting portions of the flip-flop 300 to the lower supply rail and by exploiting characteristics of dynamic circuits, the flip-flop 300 accomplishes both its flip-flop function and a level shifting function.

The flip-flop 300 generally includes a master latch 304 and a slave latch 308. The master latch 304 and the slave latch 308 operate together to capture data present on the input 312 during the rising edge of the clock 316. More particularly, the logical value at the input 312 is transparent through the master latch 304 during a particular clock phase. At a clock edge, the logical value present at the input 312 is captured by the slave latch 308 and maintained at output 320 during the remainder of the clock 116 cycle.

In capturing data present at the input 312, the master latch 304 includes pre-charge transistors 324 and evaluate transistor 328. While the clock 316 is low, the pre-charge transistors 324 pre-charge internal nodes 332a and 332b to a high voltage. Depending on the logical value present at input 312, one of the internal nodes 332a or 332b will be pulled low during the evaluate phase. In this regard, the path to ground for internal nodes 332a and 332b includes differential pair transistors 336a and 336b. Transistor 336a is supplied directly with the data line 312. Transistor 336b is supplied with the inverse of the data input 312. This inverted line is referred to herein as data complement 340. As transistors 336a and 336b are provided with opposite values, one or the other will be on. When the clock line is high, the evaluate transistor 328 is on. During this phase, depending on which of the differential pair transistors 336a and 336b is on, one of the internal nodes of 332a and 332b will discharge. Following the discharge of one of the internal nodes 332a or 332b, the master latch 304 will drive the slave latch 308 through the operation of pull-up transistor 344 and pull-down transistor 348. Specifically, depending on the input at 312, the node 352 will be driven high or low. In driving the node 352 low, the pull-up transistor 344 will be off and the pull-down transistor 348 will be on. In driving the node 352 high, the pull-up transistor 344 will be on and the pull-down transistor 348 will be off. In this way, the logical value present at data input 312 will be present or transparent to the node 352 and thereby available to be captured by the slave latch 308.

While the flip-flop 300 may perform this state function, the flip-flop 300 may additionally shift between levels or voltage domains. In particular, data 312 and data complement 340 may be supplied from a lower level voltage domain $V_{DD}$ and the circuit 300 will operate with the expected logical or state function. In this regard, the data complement value 340 is provided by inverting the data value 312 in the lower level voltage domain $V_{DD}$. This is accomplished with an inverter 356 that has data 312 as an input and produces data complement 340 as an output.

Figure 4:
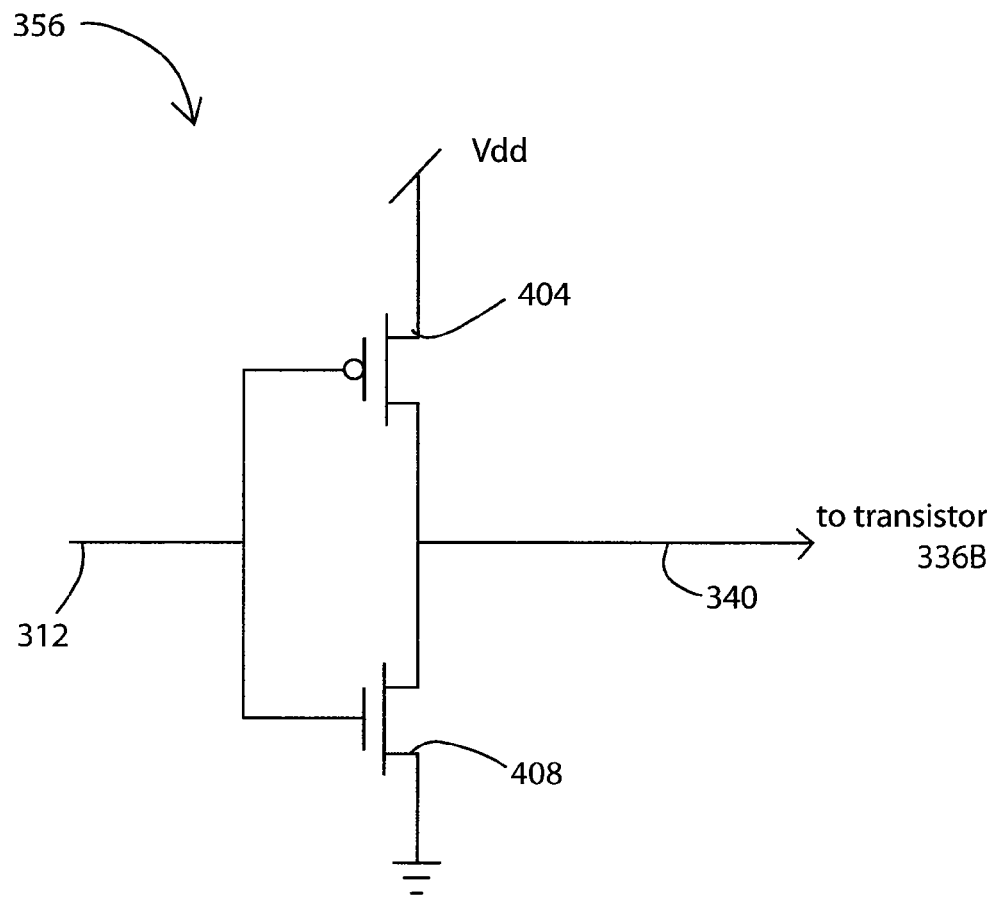
FIG. 4 is a schematic illustration of an inverter portion of the level shifter flip-flop shown in FIG. 3.

Turning now to FIG. 4, an illustration of the inverter 356 is shown. The inverter 356 includes pull-up transistor 404 and pull-down transistor 408. Notably, here the pull-up transistor 404 is connected to the lower level power supply rail $V_{DD}$. With a low logic level at input 312, the pull-up transistor 404 is on and the pull-down transistor 408 is off. Here, the output 304 is pulled up to the power supply rail $V_{DD}$ with a logical low value at the input 312. With a high logic value at the input 312, the pull-up transistor 404 is off and the pull-down transistor 408 is on. Here, the output 304 is pulled down to ground. As shown in FIG. 3, data complement 304 is provided to differential pair transistor 336B. As the inverter 356 is disposed in lower level voltage domain $V_{DD}$, a logical values are presented to the differential pair transistors 336A and 336B with voltage levels associated with the lower level voltage domain $V_{DD}$.

The inverter 356 is a component of a flip-flop. In one arrangement, the inverter 356, specifically the pull-up transistor 404, is connected to the power supply rail of the higher voltage domain $V_{CS}$. In this arrangement, an undesirable situation would arise if the input 312 were to be driven by logic values associated with the lower level voltage region $V_{DD}$. In particular, the high voltage level, which when presented at data input 312, would be insufficient to adequately establish a stable output at data complement 340. In particular, the pull-up transistor 404 would not be completely off and the pull-down transistor 404 would not be completely on. In this conventional arrangement, an indeterminate value may exist at data complement 340 and thus at the gate of differential pair transistor 336B. Accordingly, improper operation of the flip-flop 300 may result.

As shown in FIG. 4, implementations discussed herein include positioning inverter 356 in the lower voltage domain $V_{CS}$. In this way, the inverter 356 will operate properly when driven by the voltage levels associated with the lower level voltage region $V_{DD}$. Accordingly, data 312 and data complement 340 are presented to the differential transistor pair 336a and 336b with voltage levels associated with the lower level voltage region $V_{DD}$. These lower level voltage levels may then be used to selectively discharge the internal nodes 332a and 332b through the operation of the differential pair transistors 336a and 336b. In discharging a particular node 332a or 332b, an input or gate voltage at the differential pair transistors 336a and 336b only needs to be in excess of the transistor's threshold voltage and does not need to reach the power supply rail $V_{CS}$. This is due to the fact that the internal nodes 332a and 332b are not actively driven high, but instead are pre-charged to a high value during a portion of the clock 316 cycle. Accordingly, the differential pair transistors 336a and 336b may be gated by logic values within the lower level voltage domain $V_{DD}$.

In accordance with implementations discussed herein, the differential pair transistors 336a and 336b may be sized appropriately to compensate for the lower drive strength associated with gate values provided from a lower level voltage region $V_{DD}$. In one particular example, the width of the differential pair transistors may be between approximately 0.8 microns and 0.4 microns. In another example, the width of the differential pair transistors is approximately 0.6 microns. The ratio of the width of a differential pair transistor 336a to the width of a keeper transistor may be between 8 to 1 and 4 to 1. In yet another example, the ratio of the width of the differential pair transistor to the width of the keeper transistor is 5 to 1.

In one arrangement, a flip-flop resides in a single voltage domain and is supplied with two power lines. In this arrangement, a flip-flop is provided with a ground power line and with a power supply rail line. A flip-flop in accordance with implementations discussed herein is provided with three power supply lines, specifically, a ground power supply line, a higher power supply rail ($V_{CS}$) and a lower power supply rail ($V_{DD}$).

Figure 5A:
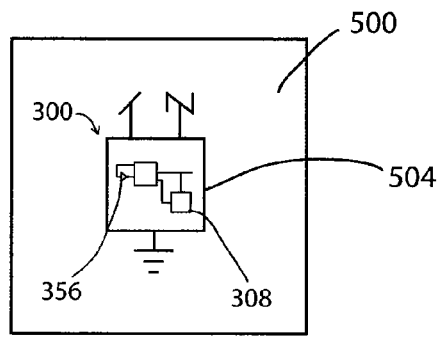
FIG. 5A through 5C are schematic illustrations of flip-flop level shifter orientations.
Figure 5B:
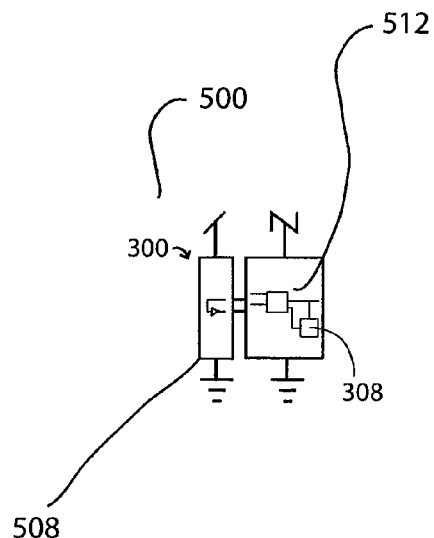

Turning now to FIG. 5A, a schematic illustration of an integrated circuit 500 is shown. In accordance with implementations discussed herein, the flip-flop 300 may be considered or implemented as a single integrated circuit cell 504. In considering flip-flop 300 as a single cell, it should be appreciated that the cell 504 is provided with two power supply lines and a ground line as shown in FIG. 5A. FIG. 5B shows an alternative implementation wherein the flip-flop 300 is considered as two separate cells, each supplied with a separate power supply rail. In particular, a first cell 508 is provided with the lower level power supply rail $V_{DD}$ and a second cell 512 is supplied with the higher level power supply rail $V_{CS}$. In the implementation shown in FIG. 5B, the cell 508 includes the inverter 356, while the cell 512 includes the remainder of the flip-flop 300.

Regardless of the manner in which the flip-flop 300 is viewed, it should be appreciated that the flip-flop accomplishes its conventional logical function as well as a level shifting function. Moreover, in accomplishing these two functions, no additional circuit elements are added in addition to those typically associated with a conventional flip-flop. In this way, no additional circuit stages or elements are added which would otherwise lead to unwanted circuit delays or chip area usage. With reference to FIG. 5B, it should be appreciated that the first cell 508 does not include any components that are added in addition to the normal components of a conventional flip-flop. In particular, the associated inverter 356 is part of the normal delay path of a conventional flip-flop.

Figure 5C:
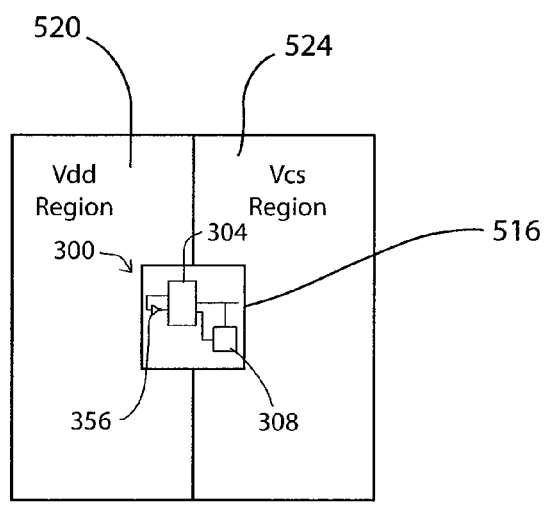

In accordance with implementations discussed herein, the flip-flop 300 is associated with a cell that is disposed on a boundary between voltage regions. As shown in FIG. 5C, the circuit cell 516 is disposed between lower level voltage region $V_{DD}$ (520), and higher level voltage region $V_{CS}$ (524). In arranging the circuit cell 516 in this position, an undesirable configuration is avoided in which power supply rails typically associated with the $V_{DD}$ region are extended into the $V_{CS}$ region. Likewise, power supply rails associated with the $V_{CS}$ region are not extended into the $V_{DD}$ region.

Figure 6:
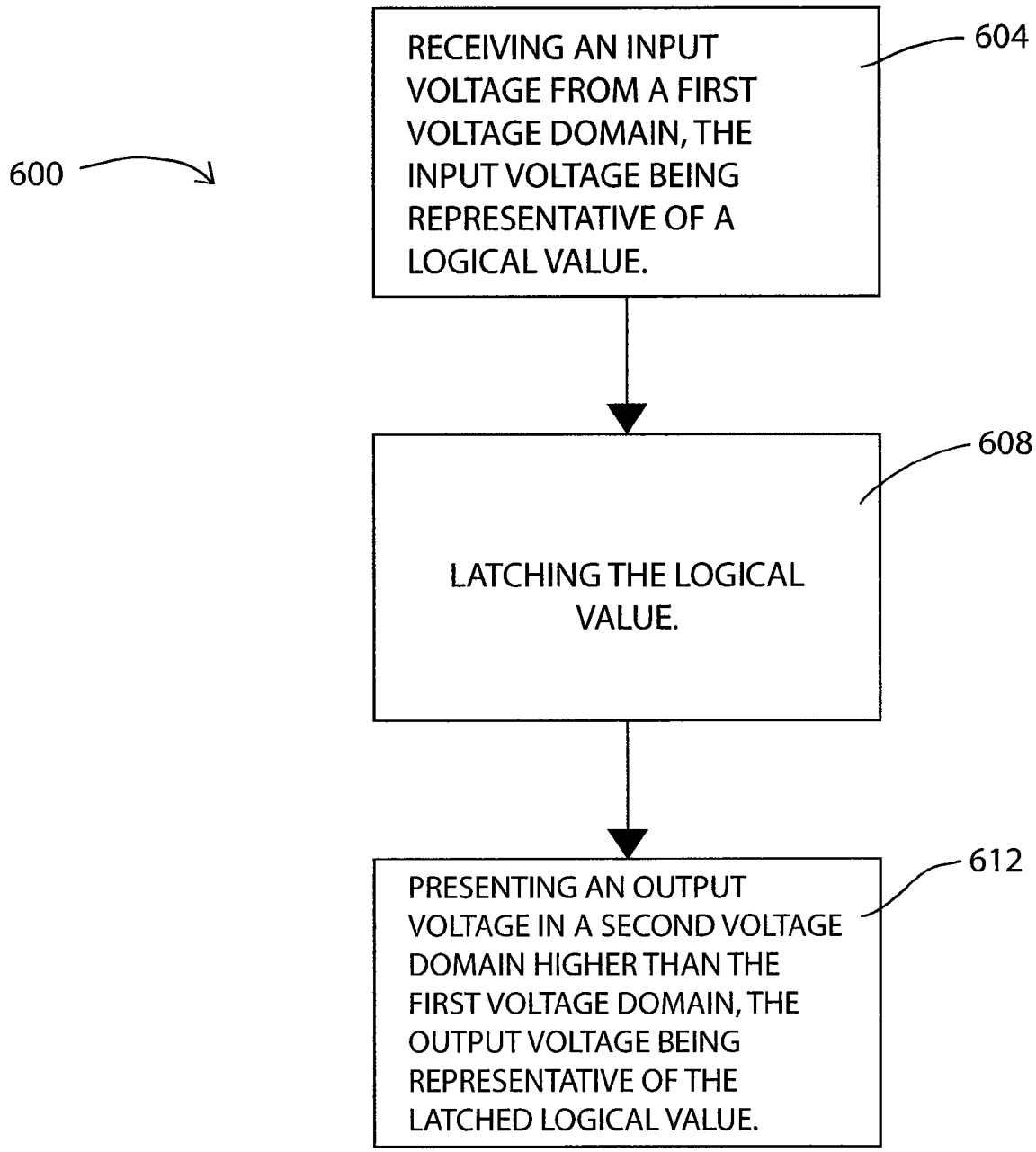
FIG. 6 is a flow chart illustrating operations in accordance with the method in accordance with the implementation discussed herein.

Turning now to FIG. 6, reference is made to a flow chart generally identified with reference number 600. The method illustrated by flow chart 600 summarizes an operation of a flip-flop. With specific reference to the flip-flop 300 shown in FIG. 3, at step 604, an input voltage is received at input 312. The input is received at input 312 from a first voltage region. The first voltage region may be a section or region of an integrated circuit (IC) containing circuits, such the IC's digital circuits, that operate at a relatively low voltage. The flip-flop 300 may be disposed on or near a border between the first voltage region and another voltage region operating a higher voltage. The input received at input 312 is representative of a logical value. As signals pass between these voltage regions the voltages that represent logical values may need to shift. Generally, a voltage range substantially close to ground is representative of a logical zero, whereas a voltage range substantially close to the power supply rail $V_{DD}$ is representative of a logical one. After a voltage representative a logical value is received at operation 604, operation 608 may be executed.

At operation 608 the logical value present at the input 312 is captured or latched by the flip-flop 300. This may include capturing the logical value 312 at a clock 316 edge. In capturing a logical value at a clock edge, the flip-flop may include a master latch 304 that is associated with a slave latch 308. After operation 608, operation 612 may be executed.

At operation 612 an output voltage is presented at the output 320. The output presented at 320 is in the voltage domain $V_{CS}$ and is representative of the logic value that was present at data input 312. At the logical output 320, the logical value is presented in a voltage domain that is higher than the voltage domain present at the input 312. Accordingly, the method illustrated by flow chart 600 accomplishes two functions. Through the operation of one circuit stage, a logical value is stored and level shift occurs.

Figure 7:
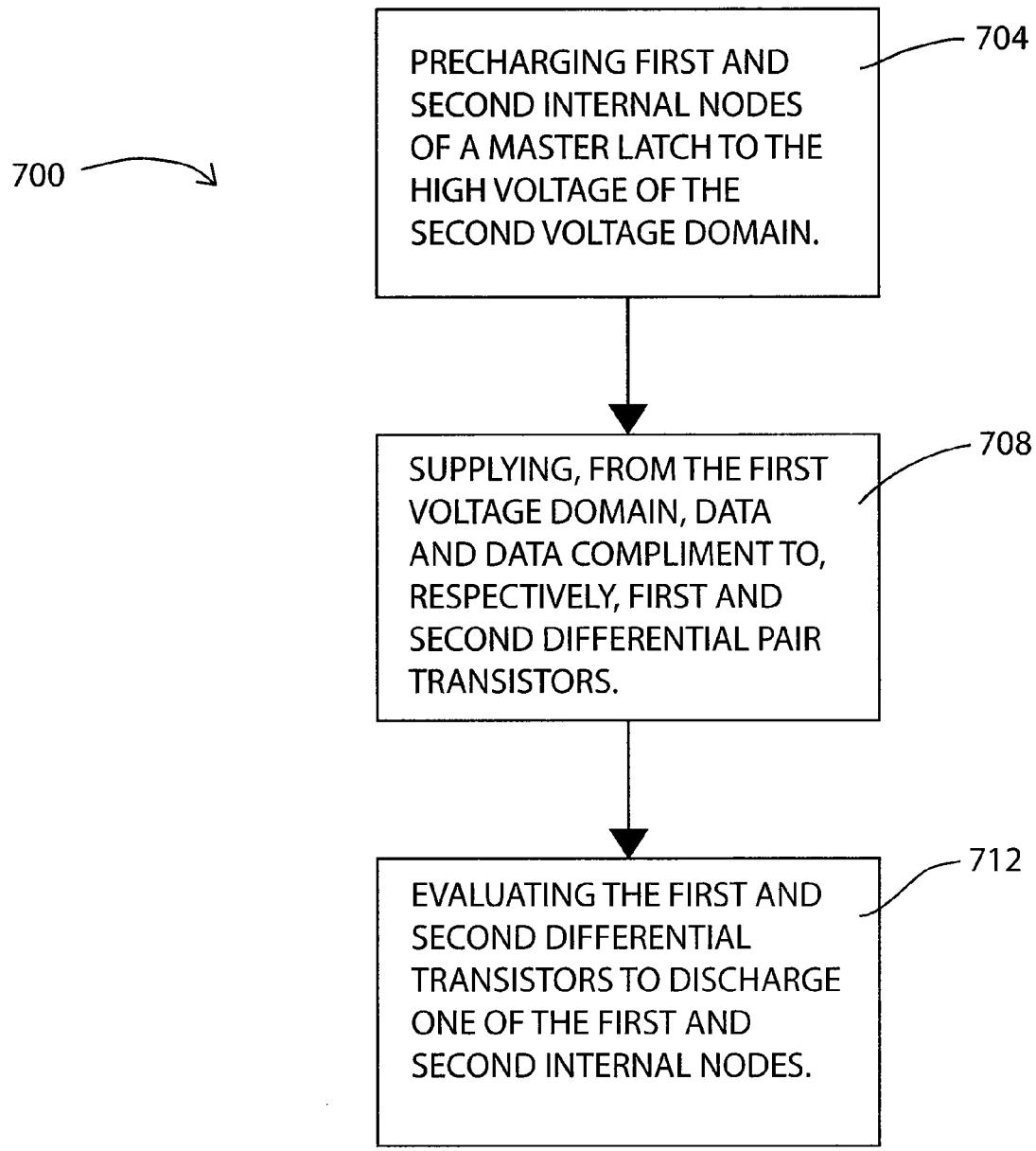
FIG. 7 is a flow chart showing further operations in accordance with the method in accordance with the implementations discussed herein.

FIG. 7 includes a flow-chart generally identified with reference number 700. Flow chart 700 illustrates a method including further aspects of latching a logic value in accordance with implementation as discussed herein. In this regard, flow chart 700 may be considered an elaboration of operation 608, shown in FIG. 6. Initially, at operation 704, first and second internal nodes 332a and 332b of flip-flop 300 are pre-charged. Pre-charging the internal nodes 332a and 332b may occur during a low portion of the clock 316. The pre-charge transistors 324 may pull the nodes up to the power supply rail $V_{CS}$. After operation 704, operation 708 may be executed.

At operation 708, the differential pair transistors 336A and 336B may be supplied with data 312 and data complement 340 from a lower level voltage domain $V_{DD}$. Supplying data complement 340, may include an inverter 356 that is associated or otherwise resides in the lower level voltage domain $V_{DD}$. The inverter 356 may be provided with data 312 at its input and may provide data complement 340 at its output. Both data 312 and data complement 340 are logical values that are presented in the lower level voltage domain $V_{DD}$. After operation 708, operation 712 may follow.

At operation 712, the differential pair transistors 336A and 336B may evaluate their respective inputs. More particularly, when the clock 316 is high, the pre-charge transistors 324 are off and the evaluate transistor 328 is on. With the evaluate transistor 328 on, a path to ground is provided for either of the differential pair transistors 336a and 336b depending on the value of data 312 and data complement 340. In turning on either of the differential pair transistors 336a or 336b, the gate voltages may only need to exceed the threshold voltages associated with the differential pair transistors. Such a voltage is sufficient to turn the transistors on and discharge one of the internal nodes 332a or 332b. In this way, the master latch 304 operates as expected.

The foregoing merely illustrates certain principles of aspects of the invention with reference to circuit implementations that conform to inventive concepts. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

The invention claimed is:

1. A flip-flop, comprising:
a data input line carrying a logical value represented by a first voltage range, the first voltage range between a reference voltage and a first power supply rail;
a data complement line connected to the data input line through an inverter, wherein the inverter is connected to the first power supply rail;
first and second transistors, the first transistor connected to the data input line and the second transistor connected to the data complement line;
first and second pre-charge nodes, the first pre-charge node connected to the first transistor and the second pre-charge node connected to the second transistor;
a first keeper transistor connected to the first transistor, wherein the ratio of the width of the first transistor to the width of the keeper transistor is between 8 to 1 and 4 to 1;
a clock line operable to trigger a capture of the logical value carried by the data input to form a captured logical value; and
a data output line carrying the captured logical value represented by a second voltage range, the second voltage range between the reference voltage and a second power supply rail, wherein the capture of the logical value includes a discharge of one of the first and second pre-charge nodes by a path to ground through one of the first and second transistors by one of the data input and data complement lines;
wherein the second power supply rail is greater than the first power supply rail.

2. The flip-flop of claim 1, wherein during a pre-charge phase, the first and second pre-charge nodes are charged to a voltage of approximately the second power supply rail.

3. The flip-flop of claim 1, wherein the first power supply rail is greater than a threshold voltage of the first and second transistors.

4. The flip-flop of claim 1,
wherein the ratio of the width of the first transistor to the width of the first keeper transistor is 5 to 1.

5. The flip-flop of claim 1, wherein the width of the first transistor is 0.6 microns.

6. The flip-flop of claim 1, wherein the data input line is associated with a first integrated circuit region that is powered by the first power supply rail, and the data output line is associated with a second integrated circuit region that is powered by the second power supply region.

7. The flip-flop of claim 6, wherein the flip-flop is located at a boundary between the first integrated circuit region and the second integrated circuit region.

8. A method of shifting voltage levels between voltage domains of a semiconductor device, comprising:
receiving an input voltage at an input to a circuit stage from a first voltage domain defined by a first power supply rail, the first voltage being representative of a logical value, the input having a data input line connected to a first transistor and a data complement line connected to the data input line through an inverter and connected to a second transistor, the inverter being connected to the first power supply rail, wherein the first transistor is connected to a first pre-charge node and the second transistor is connected to a second pre-charge node;
latching the logical value at the circuit stage including discharging of one of the first and second pre-charge nodes by a path to ground through one of the first and second transistors based on the input voltage;
driving at least one of the pre-charged nodes with at least one of the first and second transistors, the first and second transistors sized to compensate for a drive strength associated with the input voltage from the first voltage domain; and
presenting an output voltage at an output of the circuit stage in a second voltage domain, the second voltage domain higher than the first voltage domain, the output voltage being representative of the latched logical value.

9. The level shifting method of claim 8, wherein latching the logical value includes pre-charging the first and second pre-charge nodes.

10. A flip-flop, comprising:
means for carrying an input logical value represented by a first voltage range, the first voltage range between a reference voltage and a first power supply rail, the means for carrying including a data line and a data complement line;
means for triggering a capture of the input logical value carried by the means for carrying including discharging one of a fist and second pre-charge nodes based on the data line and the data complement line, wherein the capture results in a captured logical value;
means for driving at least one of the first and second pre-charge nodes with one of the data line and the data complement line, the means for driving compensating for a drive strength of the signal received in the first voltage range; and
means for carrying the captured logical value represented by a second voltage range, the second voltage range between the reference voltage and a second power supply rail, wherein the second power supply rail is greater than the first power supply rail.

11. The flip-flop of claim 10, further comprising:

means for inverting the data line to form the data complement line wherein the means for inverting is connected to the first power supply rail.

12. The flip-flop of claim 11, further comprising:
first and second means for holding a charge, the first means for holding a charge connected to the first pre-charge node and the second means for holding a charge connected to the second pre-charge node.

13. The flip-flop of claim 12, wherein during a pre-charge phase, the first and second pre-charge nodes are charged to a voltage of approximately the second power supply rail.

14. The flip-flop of claim 12, wherein the first power supply rail is greater than a threshold voltage of the first and second means for driving.

15. The flip-flop of claim 12, wherein the means for carrying an input logical value is associated with an integrated circuit region that is powered by the first power supply rail, and the means for carrying an output logical value is associated with an integrated circuit region that is powered by the second power supply region.

16. The flip-flop of claim 1, further comprising:
a second keeper transistor connected to the second transistor, wherein the ratio of the width of the second transistor to the width of the second keeper transistor is between 8 to 1 and 4 to 1.

17. The flip-flop of claim 16, wherein the ratio of the width of the second transistor to the width of the second keeper transistor is 5 to 1.

18. The level shifting method of claim 8, wherein the ratio of the width of the first transistor to the width of a keeper transistor connected to the first pre-charge node is between 8 to 1 and 4 to 1.

19. The level shifting method of claim 18, wherein the ratio of the width of the first transistor to the width of the keeper transistor is 5 to 1.

* * * * *